United States Patent [19]

Davies et al.

[11] 4,313,783
[45] Feb. 2, 1982

[54] COMPUTER CONTROLLED SYSTEM FOR PROCESSING SEMICONDUCTOR WAFERS

[75] Inventors: John T. Davies, El Sobrante; Richard F. Reichelderfer, Castro Valley, both of Calif.

[73] Assignee: Branson International Plasma Corporation, Hayward, Calif.

[21] Appl. No.: 151,169

[22] Filed: May 19, 1980

[51] Int. Cl.³ .................... C23C 15/00; H01L 21/306
[52] U.S. Cl. .................................. 156/643; 118/731; 156/345; 156/646; 198/776; 204/192 E; 204/298
[58] Field of Search ....................... 156/345, 643, 646; 204/298, 192 E; 198/776; 118/731; 269/21

[56] References Cited

U.S. PATENT DOCUMENTS

| | | | |
|---|---|---|---|
| 3,326,717 | 6/1967 | Gregar et al. | 118/731 |
| 3,677,924 | 7/1972 | Gash et al. | 204/298 |
| 3,756,939 | 9/1973 | Hurwitt | 204/298 |
| 3,838,031 | 9/1974 | Snaper | 204/298 |
| 3,857,479 | 12/1974 | Brems | 198/776 |
| 4,131,267 | 12/1978 | Ono et al. | 269/21 |
| 4,149,923 | 4/1979 | Uehara et al. | 156/345 |
| 4,151,034 | 4/1979 | Yamamoto et al. | 156/345 |
| 4,192,706 | 3/1980 | Horiike | 156/643 |
| 4,209,357 | 6/1980 | Gorin et al. | 156/345 |
| 4,252,595 | 2/1981 | Yamamoto et al. | 156/643 |

FOREIGN PATENT DOCUMENTS 2730819  1/1979  Fed. Rep. of Germany ...... 156/643

OTHER PUBLICATIONS

Hutt, "Microprocessor . . . Sputtering", Solid State Technology (12/76), pp. 74–76.

Primary Examiner—Jerome W. Massie
Attorney, Agent, or Firm—Flehr, Hohbach, Test, Albritton & Herbert

[57] ABSTRACT

Automated reactor system and process for etching or otherwise processing semiconductor wafers in a plasma environment. The wafers are carried into and out of a reaction chamber by a conveyor and processed on an individual basis. Within the chamber, an electrode mounted on a swinging arm carries each wafer from the conveyor to a processing position adjacent to a stationary electrode. Gas is admitted to the chamber, and the electrodes are energized to ionize the gas and form a plasma for processing the wafer between the electrodes.

26 Claims, 7 Drawing Figures

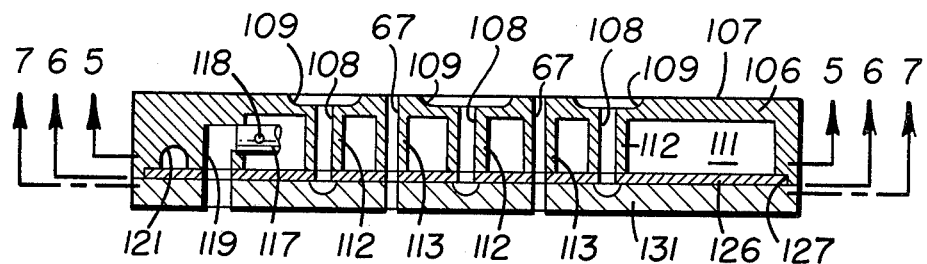
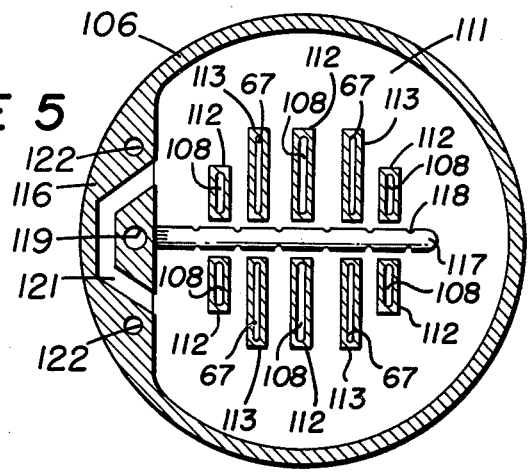
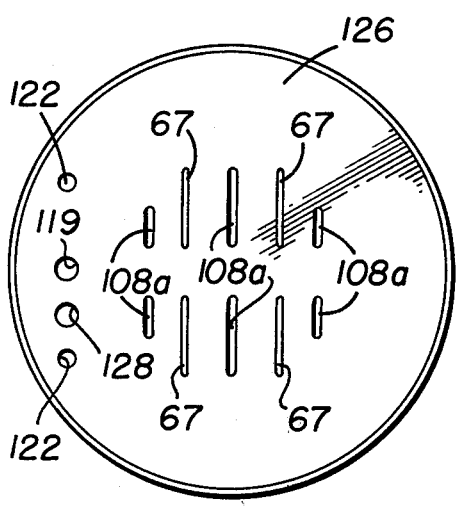
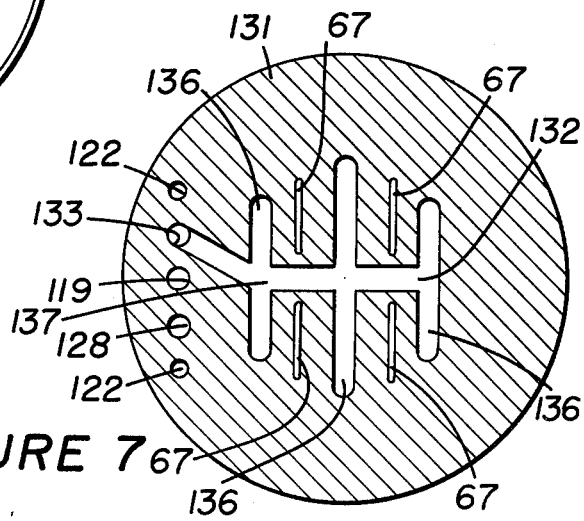

COMPUTER CONTROLLED SYSTEM FOR PROCESSING SEMICONDUCTOR WAFERS

This invention pertains generally to gas plasma reactors and more particularly to an automated system and process for etching or otherwise processing semiconductor wafers.

Reactors heretofore employed in plasma processing of semiconductor wafers have been of two basic types: planar reactors and cylindrical reactors. In order to increase the throughput or number of wafers processed, the wafers are processed in batches in these reactors. However, the number of wafers which can be processed in a given time is limited by the size of the reactor and the speed of the process employed. In addition, when wafers are processed in batches, it is generally difficult to obtain uniform processing across the individual wafers, from wafer to wafer and from run to run.

It is in general an object of the invention to provide a new and improved system and process for etching or otherwise processing semiconductor wafers in plasma environment.

Another object of the invention is to provide a system and process of the above character in which the wafers are processed on an individual basis.

Another object of the invention is to provide a system and process of the above character which are capable of automated operation under the control of a computer.

These and other objects are achieved in accordance with the invention by providing a reactor system having a chamber in which the wafers are processed, with a conveyor for carrying the wafers into and out of the chamber through load locks. Within the chamber, a first electrode is mounted in a stationary position, and a second electrode is mounted on a swinging arm for movement from a wafer receiving position adjacent to the conveyor and a wafer processing position adjacent to the first electrode. The wafers are transferred from the conveyor to the second electrode and secured to that electrode for movement to the processing position. Reagent gas is admitted to the chamber, and the electrodes are energized to ionize the gas and form a plasma between the electrodes for processing the wafer. In the presently preferred embodiment, the wafer is secured to the second electrode by means of a vacuum chuck, and the first electrode has a platen of porous material through which the gas is admitted to the chamber. Upon completion of the desired processing, the second electrode returns to the wafer receiving position, and the wafer is transferred back to the conveyor and out of the chamber. The reactor operates in a automated manner under the control of a computer.

FIG. 4 is a sectional view taken along line 4—4 in FIG. 2.

FIG. 5 is a cross-sectional view taken along line 5—5 in FIG. 4.

FIG. 6 is a cross-sectional view taken along line 6—6 in FIG. 4.

FIG. 7 is a cross-sectional view taken along line 7—7 in FIG. 4.

Figure 1:
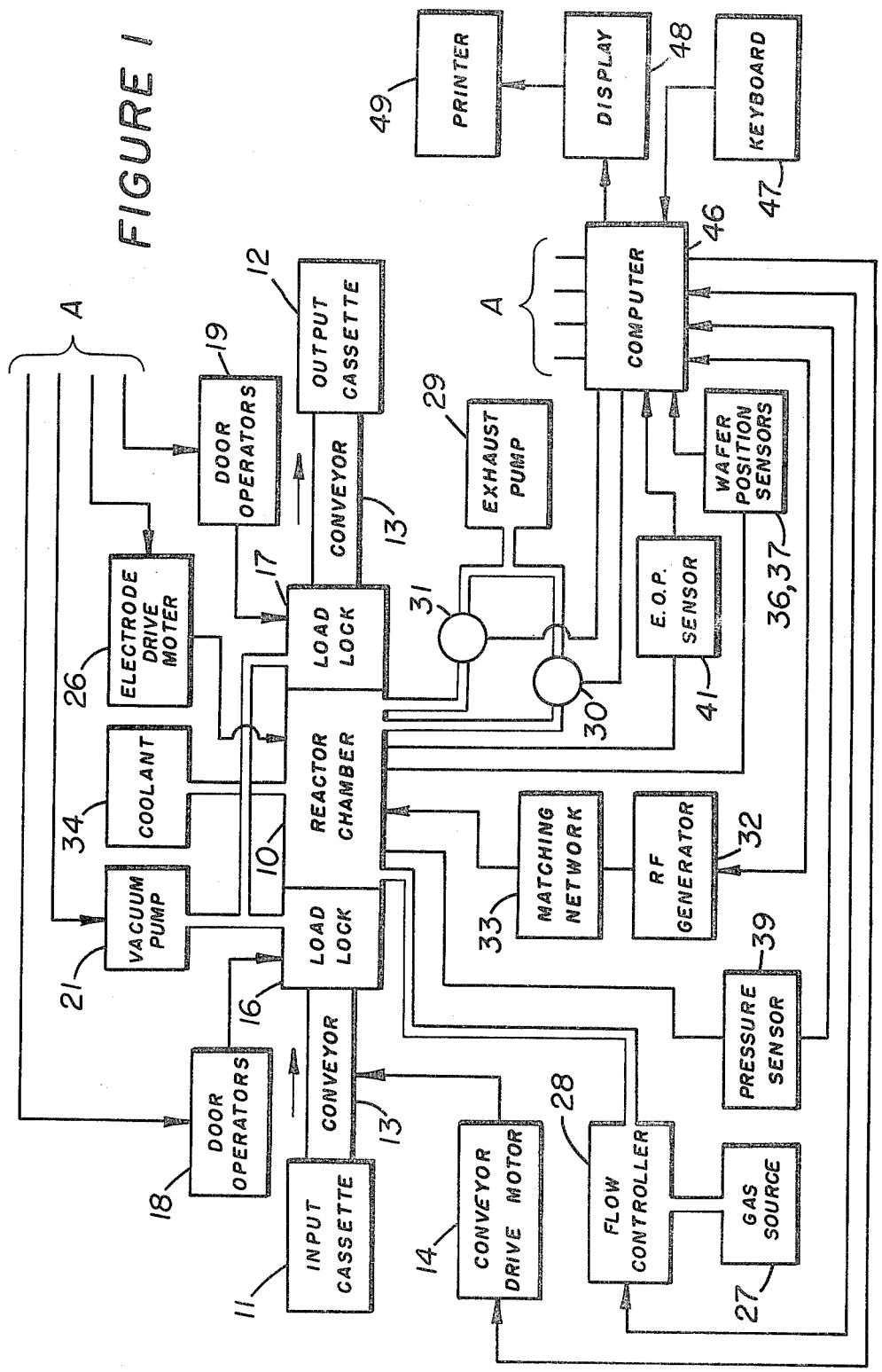
FIG. 1 is a block diagram of one embodiment of a reactor system according to the invention.

As illustrated in FIG. 1, the reactor system includes a reaction chamber 10 in which the wafers are processed. Wafers to be processed are stacked in an input cassette 11, and wafers which have been processed are stacked in an output cassette 12. The two cassettes are positioned externally of the reactor chamber, and the wafers are carried between the cassettes and the chamber by a conveyor 13 driven by a motor 14.

The wafers enter the reactor chamber and leave the chamber through load locks 16, 17 which maintain the chamber in a closed condition notwithstanding passage of the wafers. The load locks are of conventional design and include internal chambers with entry and exit doors on opposite sides thereof. The doors are operated by door operators 18, 19, before the doors leading to the reaction chamber are opened, the pressure within the load lock chambers is reduced to a level below that of the reactor chamber by a vacuum pump 21. Before the outer doors are opened, the load lock chambers are purged with an inert gas, and the pressure in these chambers is raised to a level above atmospheric pressure.

As discussed more fully hereinafter, a stationary electrode 23 and a movable electrode 24 are provided in the reactor chamber. The movable electrode receives the wafers from the conveyor and carries them into an inverted position above the stationary electrode for processing in a plasma which is formed between the electrodes. The movable electrode is driven between the wafer receiving and processing positions by a drive motor 26, and the wafers are secured to the movable electrode by a vacuum operated chuck.

Reagent gases and other gases (e.g. purging gases) are introduced into the reactor chamber from one or more gas sources 27 through a flow controller 28. Gases are exhausted from the chamber by an exhaust pump 29 through a throttle valve 30. Vacuum is applied to the electrode chuck from pump 29 through a solenoid controlled valve 31.

Electrical power for energizing the electrodes is provided by a radio frequency generator 32 operating at a suitable power and frequency. The output of the generator is connected to the electrodes by a matching network 33. Coolant is circulated through the electrodes from a coolant source 34 in order to maintain the electrodes at a desired temperature. The temperature of the coolant is maintained by a sensor at the coolant reservoir, and the coolant temperature is regulated by the source.

Wafer position sensors 36, 37 are mounted in the reactor chamber and detect when a wafer is transferred from the conveyor to the movable electrode or from the electrode back to the conveyor. In the preferred embodiment, these sensors are photoelectric devices, but other suitable sensors can be utilized, if desired. Pressure within the reaction chamber are monitored by a sensor 39, and completion of the reaction is detected by an end-of-process sensor 41. In the presently preferred embodiment, sensor 41 is an optical sensor, and the end of the process is determined by the wavelength of the light emitted by the certain ones of the excited species which undergo a change in concentration when the process is completed.

The operation of the reactor system is controlled by a computer 46 which is programmed in accordance with the manner in which the wafers are to be processed. Any suitable computer can be utilized, and in the presently preferred embodiment, a microprocessor is employed. The computer receives inputs from the wafer position sensors, the pressure sensor, the flow controller, the RF generator, the conveyor, the load locks, and the end-of-process sensor. It provides control signals for cassettes 11, 12, conveyor drive motor 14, load lock door operators 18, 19, vacuum pump 21, electrode drive motor 26, gas flow controller 28, exhaust pump throttle valve 30, vacuum chuck control solenoid 31, and RF generator 32. Additional information can be input to the computer through a keyboard 47, and any or all of the functions of the system can be controlled manually through the keyboard. A display 48 driven by the computer provides a visual indication of commands, data and program sequencing. The information from the display is recorded by a printer 49 or other suitable recorder. The computer also includes a suitable interface for communication with other processing, recording or input equipment.

Figure 2:
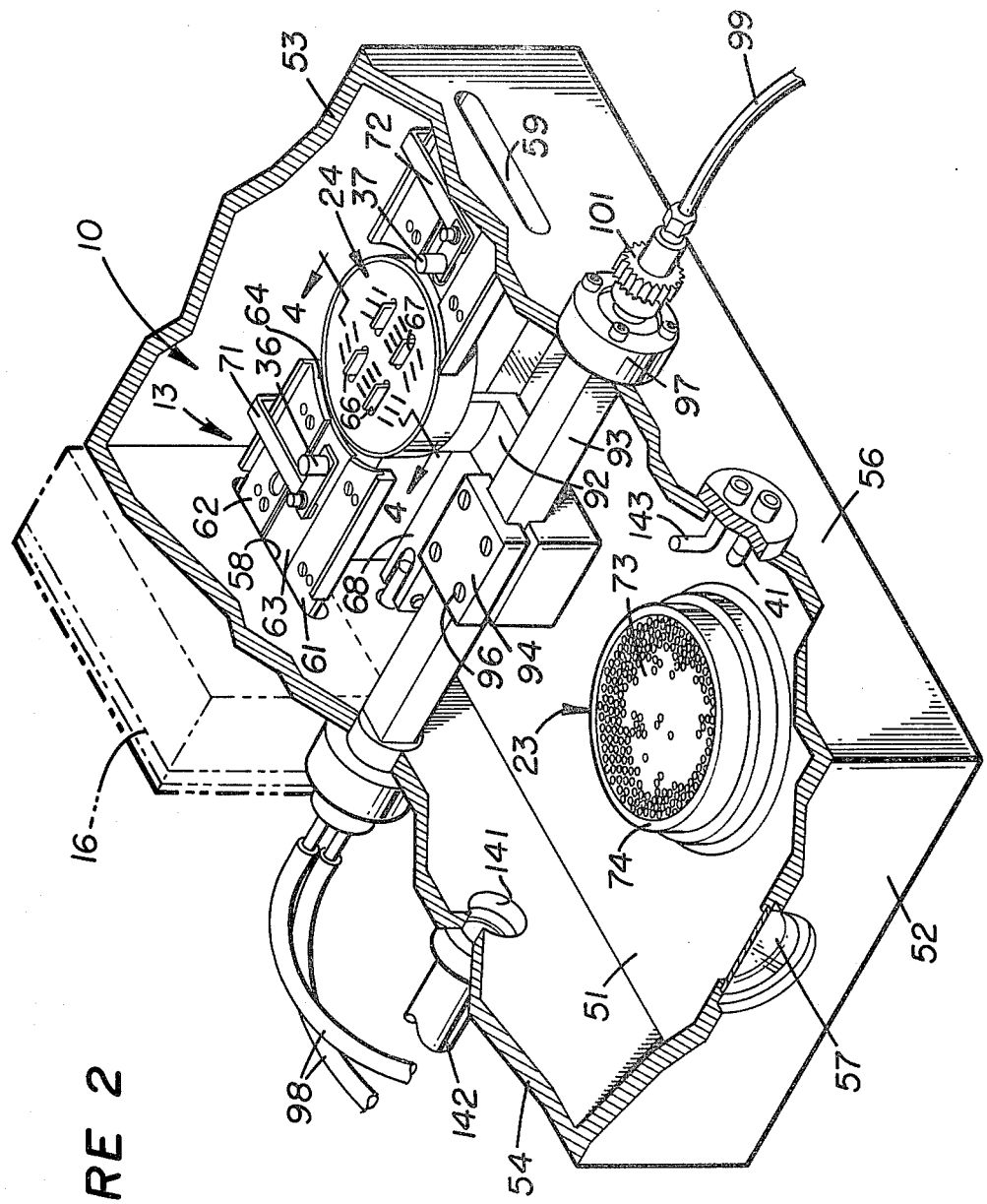
FIG. 2 is a fragmentary isometric view, partly broken away, of the reaction chamber in the embodiment of FIG. 1.

Referring now to FIG. 2, the reaction chamber and the conveyor are shown in greater detail. The chamber is generally rectangular and is formed by a bottom wall 51, a top wall (not shown), a front wall 52, a rear wall 53, and side walls 54, 56. A viewing window 57 is provided in front wall 52 to permit viewing of the process carried out in the reactor. A wafer inlet port 58 is formed in side wall 54 toward the rear of the chamber, and a wafer outlet port 59 is formed in side wall 56 in a position opposite the inlet port.

Conveyor 13 comprises a walking beam conveyor having elongated rails 61–63 which are divided into sections and extend through ports 58, 59 and the load locks associated therewith. The rail sections are spaced longitudinally apart, and the load lock doors are positioned between the sections so that the rails do not interfere with the operation of the doors. The three rails are positioned side-by-side, with rail 63 between rails 61, 62. The outer rails are driven simultaneously in a eliptical pattern relative to the inner rail, as viewed from the front of the chamber, and the alternately lifting and falling action of the rails moves the wafers through the system. The rails are aligned axially with electrode 24 when that electrode is in the position shown in FIG. 2. In that position, the electrode is received in a generally circular gap 64 between the rail sections, with the upper surface of the electrode being positioned slightly below the top surfaces of the rails.

The conveyor also includes means for transferring the wafers from the walking beam rails to movable electrode 24 and from the electrode back to the rails. This means includes a plurality of fingers 66 which pass freely through openings 67 in the electrode and project above the upper surface of the electrode. The wafer transfer fingers are operatively connected to the carrier rails by a connecting rod 68 and are driven with the same eliptical motion as the rails.

Wafer position sensors 36, 37 are mounted on mounting brackets or arms 71, 72 and positioned above the central rail of the conveyor on either side of electrode 24.

Electrode 23 is mounted in a stationary position toward the front of the chamber near viewing window 57. This electrode is insulated electrically from the reactor walls and is connected to the "hot" or ungrounded side of the generator output. Electrode 24 is grounded electrically. Electrode 23 includes a platen 73 of electrically conductive porous material through which the reagent gas is diffused into the chamber. In one presently preferred embodiment, the platen is fabricated of fritted stainless steel having a porosity or pore size on the order of 35 microns. In the embodiment illustrated, the platen is a circular disc-like structure, and a peripheral mounting ring 74 is affixed to the platen by suitable means such as shrink fitting.

Figure 3:
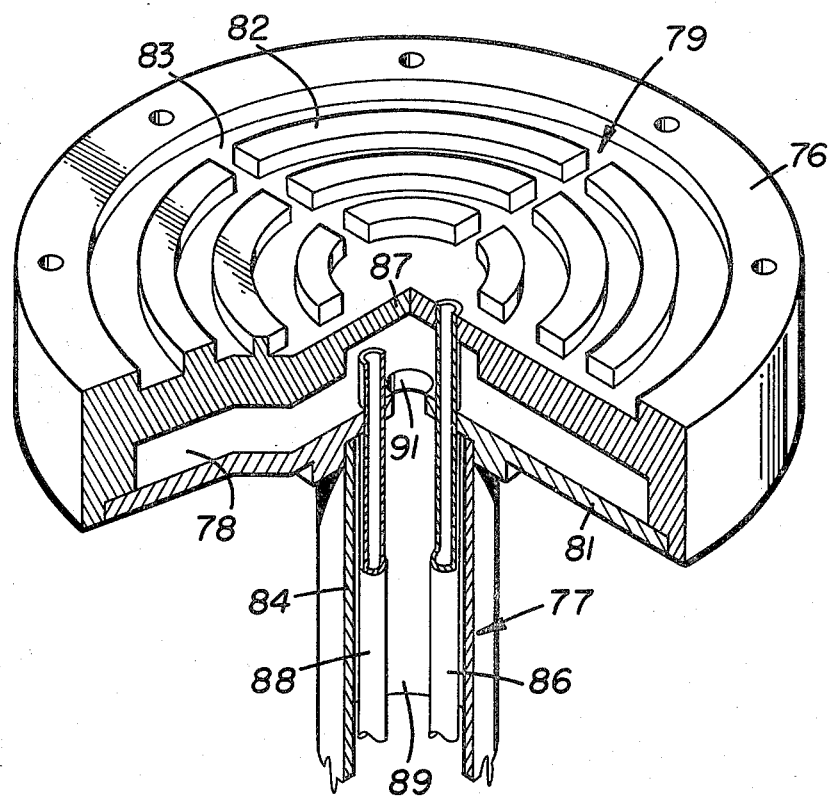
FIG. 3 is a fragmentary isometric view, partly broken away, of the stationary electrode in the reaction chamber of the embodiment of FIG. 1.

As illustrated in FIG. 3, electrode 23 also includes a cylindrical body 76 of electrically conductive material, with a depending stem 77. A cooling jacket 78 is formed in the lower portion of the electrode body, and a gas distribution chamber 79 is formed in the upper portion of the body. A generally circular bottom plate 81 is affixed to the outer wall of the electrode body and forms the bottom wall of water jacket 78. A plurality of arcuately extending baffles 82 form radially and arcuately extending channels 83 within the distribution chamber. Platen 73 is mounted on the upper portion of electrode body 76 and forms the upper wall of the distribution chamber. The distribution chamber and the cooling jacket extend throughout the lateral extent of the platen to provide uniform distribution of the gas and uniform cooling of the platen.

Stem 77 comprises a hollow tube 84 which extends downwardly from the central portion of bottom plate 81. A gas inlet tube 86 extends vertically within tube 84 and through plate 81 and the central wall 87 of body 76 to provide communication between the gas source and the distribution chamber. A coolant tube 88 also extends vertically within stem 77 and passes through bottom plate 81 into cooling jacket. Coolant is supplied to the cooling jacket through a passageway 89 formed between the outer walls of tubes 86, 88 and the inner wall of tube 77, and through an orifice 91 in plate 81. The coolant returns to the source through tube 88.

Electrode 24 is mounted on a swinging arm 92 for movement between the upright wafer receiving position illustrated in FIG. 2 and an inverted wafer processing position above stationary electrode 23. The arm is rigidly affixed to a shaft 93 of generally square cross-section by means of a cap 94 and screws 96. The shaft extends between side walls 54, 56 of the chamber and is rotatively mounted in bearing and seal assemblies 97. Coolant is circulated through electrode 24 via lines 98 and passageways (not shown) formed in shaft 93 and arm 92.

Means are provided for securing the wafers to the upper surface of electrode 24 for movement with the electrode to the processing position above stationary electrode 23. This means includes a vacuum chuck which is illustrated in FIGS. 4–7 and described hereinafter. Vacuum is applied to the chuck by exhaust pump 29 via solenoid valve 31, a vacuum line 99 and passageways (not shown) in shaft 93 and arm 92. Alternatively, other suitable means such as an electrostatic chuck can be employed for securing the wafers to the electrode.

A drive gear 101 is mounted on shaft 93 outside the reaction chamber and is driven by motor 26 to swing electrode 24 between the wafer receiving and processing positions. As illustrated in FIGS. 4–7, electrode 24 includes a generally cylindrical chuck plate 106 having a planar upper surface 107 on which the wafers are received. Vacuum passageways 108 extend vertically through the chuck plate and terminate in slots 109 formed in the upper surface of the plate. As illustrated in FIG. 2, these slots are arranged in such manner that they will be completely covered by a wafer of conventional size, e.g. 3 or 4 inches in diameter.

A recess 111 in the lower portion of chuck plate 106 provides a cooling jacket for the electrode. Vacuum passageways 108 are formed in generally rectangular bosses 112 which extend through the cooling jacket. Openings 67 for the wafer transfer fingers of the conveyor extend through generally rectangular bosses 113 and open through the upper surface of the chuck plate.

A land area 116 is formed on the under side of the chuck plate at one side of the cooling jacket. A coolant distribution tube 117 having a plurality of discharge openings 118 extends into the jacket between the rectangular bosses and communicates with an inlet passageway 119 in the land area. An outlet passageway 121 for the coolant is formed in the land area and communicates directly with the water jacket. Threaded bores 122 are formed in the lower portion of the land area to receive screws (not shown) by which the electrode is secured to the swinging arm.

Electrode 23 also includes a seal plate 126 which is mounted in a counter bore 127 on the bottom side of chuck plate 106. Wafer transfer finger openings 67 extend through this plate, and slots 108a extend through the plate in alignment with vacuum passageways 108. The upper surface of the plate abuts against the lower surfaces of shoulders 112, 113 and the land area of the chuck plate to form a fluid tight structure. Coolant inlet 119 and mounting screw bores 122 extend through plate 126, and a coolant outlet opening 128 is formed in this plate in alignment with passageway 121.

Electrode 24 also includes a manifold plate 131 which is mounted on the under sides of chuck plate 106 and seal plate 126. A manifold passageway 132 is formed in the upper surface of plate 131 and communicates with a vacuum inlet 133 which extends through the plate. The manifold passageway includes laterally extending channels 136 and an interconnecting central channel 137. Channels 136 are positioned directly beneath slots 108a and communicate with passageways 108 in the chuck plate. Finger openings 67 extend through the manifold plate, as do coolant inlet 119, coolant outlet 128 and mounting screw bores 122. The lower surface of manifold plate 131 rests on the upper surface of swinging arm 92 with the vacuum passageway, coolant inlet and coolant outlet aligned with the corresponding passageways in the arm.

An exhaust port 141 is formed in side wall 54 near stationary electrode 23 and is connected to exhaust pump 29 by an exhaust line 142 and throttle valve 30.

End-of-process sensor 41 is mounted in side wall 56 in a position generally opposite exhaust port 141. An upwardly opening gas inlet tube 143 is also mounted in side wall 56 adjacent to sensor 41. In some processes, it may be desirable to introduce certain gases (e.g. purging gases) through this tube, although all of the gases are introduced through platen 73 in the presently preferred embodiment.

Operation and use of the reactor system, and therein the method of the invention, can now be described. It is assumed that computer 41 has been programmed in accordance with the process to be performed, e.g. etching of silicon, $Si_3N_4$, $SiO_2$, or aluminum. A cassette containing the wafers to be processed is loaded onto a stacker at the input end of conveyor 13, and a cassette for receiving the processed wafers is positioned at the output end of the conveyor. The conveyor carries the wafers one at a time from the input cassette toward the reaction chamber. As each wafer approaches load lock 16, the load lock chamber is purged with inert gas, and the outer door opens to permit the wafer to pass. This door is then closed, and the pressure within the load lock chamber is reduced to a level below the pressure in the reactor chamber. The inner door of load lock 16 is then opened, and the wafer is carried into the reaction chamber. As the wafer approaches electrode 24, it is transferred in a face up position from the walking beam rails to the upper surface of the electrode by transfer fingers 66.

When the wafer has been transferred to electrode 24, motor 26 is energized to lift the wafer away from the conveyor, and the vacuum chuck is actuated to secure the wafer to the electrode. As electrode 24 swings toward electrode 23, the wafer is carried to an inverted or face down position above the surface of platen 73.

Gas is introduced into the chamber through the porous platen of electrode 23, and the electrodes are energized to ionize the gas and form a plasma for processing the wafer between the electrodes. When the process is completed, as determined by sensor 41, the electrodes are deenergized, and motor 26 is actuated to return electrode 24 and the wafer carried thereby to the position illustrated in FIG. 2. The conveyor is then reactuated to transfer the wafer from the electrode to the conveyor rails and out of the chamber through exit load lock 17. As the wafer approaches the load lock, the inner door of the lock opens, then closes behind the wafer. With the inner door closed, purging gas is admitted into the load lock chamber, and the outer door is opened to permit the wafer to leave the lock. As one wafer leaves the reactor chamber, the next wafer enters and is transferred to electrode 24 for processing in the manner described above.

Exhaust gases are removed from the reaction chamber by exhaust pump 29, and throttle valve 30 maintains the desired pressure in the chamber, as determined by sensor 39. Coolant is circulated through the electrodes to maintain the temperature at the desired level.

The invention has a number of important features and advantages. Being computer controlled, the system operates and the process is carried out in a fully automated manner. This eliminates operator expense and results in a higher throughput reduces would be possible with a manual system. The plasma is largely limited to the region between the electrodes, and this makes it possible to fabricate the conveyor and other components of materials which might otherwise be effected by the plasma. Another important advantage is that the reactor chamber is not exposed to the atmosphere, and this helps to keep it clean and free from contamination.

It is apparent from the foregoing that a new and improved system and process for etching or otherwise processing semiconductor wafers have been provided. While only certainly presently preferred embodiments have been described in detail, as will be apparent to those familiar with the art, certain changes and modifications can be made without departing from the scope of the invention as defined by the following claims. 9n

We claim:

1. In a wafer processing system: means defining a reaction chamber, a first electrode mounted in a predetermined position within the chamber, a second electrode mounted on a swinging arm for movement between an upright wafer receiving position away from the first electrode and an inverted wafer processing position above the first electrode, conveyor means for transporting a wafer to and from the second electrode when the second electrode is in the wafer receiving position, means for securing the wafer to the second electrode for movement with said electrode between the wafer receiving position and the wafer processing position, means for introducing a reagent gas into the chamber, and means for energizing the electrodes to ionize the gas and form a plasma for processing the wafer between the electrodes when the second electrode is in the processing position above the first electrode.

2. The system of claim 1 wherein the first electrode comprises a platen of porous material through which the gas is introduced into the chamber.

3. The system of claim 2 wherein the first electrode comprises a body of electrically conductive material on which the platen is mounted, with a gas distribution chamber in the upper portion of the body directly below the platen, and a gas inlet passageway communicating with the distribution chamber.

4. The system of claim 1 wherein the means for securing the wafer to the second electrode comprises a vacuum chuck.

5. The system of claim 1 wherein the second electrode comprises a body having a generally planar wall on which the wafer is received, a vacuum chamber within the body connected to a source of vacuum, and a plurality of openings extending through the wall in communication with the vacuum chamber for applying the vacuum to the backside of a wafer received on the wall.

6. The system of claim 1 wherein the first electrode comprises a body of gas impervious material, a platen of porous material mounted on the body, a gas distribution chamber in the body adjacent to the platen, and a gas inlet passageway communicating with the distribution chamber for introducing the reagent gas into the distribution chamber for diffusion through the platen of porous material into the reaction chamber.

7. The system of claim 6 including baffle means within the distribution chamber for delivering the reagent gas to the platen in a substantially uniform manner throughout the lateral extent of the platen.

8. The system of claim 6 including means for controlling the temperature of the electrodes.

9. The system of claim 1 wherein the reaction chamber includes inlet and outlet ports with load locks through which the wafer is carried by the conveyor means.

10. The system of claim 1 or claim 9 wherein operation of the system is controlled in a predetermined manner by a computer.

11. The system of claim 1 including means for controlling the temperature of the electrodes.

12. In a wafer processing system, means defining a reaction chamber having inlet and outlet ports, a walking beam conveyor extending through the ports for carrying a wafer into and out of the chamber, load locks associated with the inlet and outlet ports for maintaining the chamber in a closed condition as the wafer passes through the ports, a first electrode mounted in a stationary position in the chamber, a second electrode mounted on a swinging arm for movement between an upright wafer receiving position adjacent to the conveyor and an inverted wafer processing position above the first electrode, means for securing the wafer to the second electrode for movement therewith, means for introducing a reagent gas into the chamber, and means for energizing the electrodes to ionize the gas to form a plasma for processing the wafer.

13. The system of claim 12 wherein one of the electrodes comprises a platen of porous material through which the gas is diffused into the chamber.

14. The system of claim 12 including means for controlling the temperature of the electrodes.

15. In a wafer processing system, means defining a reaction chamber having inlet and outlet ports, a walking beam conveyor extending through the ports for carrying a wafer into and out of the chamber, load locks associated with the inlet and outlet ports for maintaining the chamber in a closed condition as the wafer passes through the ports, means for introducing a reagent gas into the chamber, and electrically energized electrodes for ionizing the gas to form a plasma for processing the wafer, said electrodes comprising a first electrode mounted in a stationary position away from the conveyor, a second electrode mounted on a swinging arm for movement between an upright wafer receiving position adjacent to the conveyor and an inverted wafer processing position above the first electrode, and means for securing the wafer to the second electrode for movement therewith.

16. The system of claim 15 wherein the means for securing the wafer to the second electrode comprises a vacuum chuck.

17. In a wafer processing system: means defining a reaction chamber having inlet and outlet ports, load locks operable to provide access to the chamber through the ports while maintaining the chamber in a closed condition, conveyor means for carrying a wafer into and out of the chamber through the load locks, a first electrode mounted in a stationary position within the chamber, a second electrode mounted on a swinging arm for movement between an upright receiving position adjacent to the conveyor means and an inverted wafer processing position above the first electrode, means for securing the wafer to the second electrode for movement therewith, flow control means for controlling the admission of gas into the chamber, means for energizing the electrodes to ionize the gas to form a plasma for processing the wafer, and exhaust pump for evacuating the chamber, and computer means for controlling operation of the conveyor means, the load locks, the swinging arm the flow control means, the exhaust pump and energization of the electrodes to process the wafer in a predetermined manner.

18. The system of claim 17 including means for controlling the temperature of the electrodes.

19. In a process for processing a wafer having a generally planar surface in a system comprising a reaction chamber, a conveyor for carrying the wafer into and out of the chamber, a first electrode mounted in a stationary position within the chamber, and a second electrode mounted on a swinging arm for movement between a wafer receiving position and a wafer processing position, the steps of: transporting the wafer into the chamber on the conveyor transferring the wafer from the conveyor to the second electrode, securing the wafer to the second electrode, swinging the arm about an axis parallel to the wafer surface to move the second electrode and the wafer from the receiving position to the processing position, introducing reagent gas into the chamber, and energizing the electrodes to ionize the gas and form a plasma for processing the wafer.

20. The process of claim 19 further including the steps of returning the second electrode to the receiving position, transferring the wafer from the second electrode to the conveyor, and transporting the wafer out of the chamber on the conveyor.

21. The process of claim 19 wherein the wafer is held in an inverted position above the first electrode in the processing position.

22. The process of claim 19 wherein a coolant is circulated through the electrodes to control the temperature of the electrodes.

23. In a wafer processing system: means defining a reaction chamber, a first electrode mounted in a predetermined position within the chamber, a second electrode mounted on a swinging arm for movement between a wafer receiving position away from the first electrode and a wafer processing position adjacent to the first electrode, conveyor means comprising a walking beam having relatively moveable elongated rails for carrying the wafer to and from the reaction chamber, a plurality of fingers operatively connected to the rails and extending through openings in the second electrode for moving the wafer onto and off of the second electrode when said electrode is in the wafer receiving position, means for securing the wafer to the second electrode for movement with said electrode between the wafer receiving position and the wafer processing position, means for introducing a reagent gas into the chamber, and means for energizing the electrodes to ionize the gas and form a plasma for processing the wafer between the electrodes when the second electrode is in the processing position above the first electrode.

24. In a wafer processing system: a reaction chamber, means for introducing a reagent gas into the chamber, first and second electrically energized electrodes for ionizing the gas to form a plasma for processing the wafer, conveyor means for transporting the wafer into and out of the reaction chamber, and a plurality of fingers operatively connected to the conveyor means and extending through openings in one of the electrodes for transferring the wafer between the conveyor means and the one electrode.

25. The system of claim 24 wherein the conveyor means comprises a walking beam conveyor having relatively moveable elongated rails aligned with the electrode through which the fingers extend.

26. The system of claim 24 wherein the electrode through which the fingers extend is mounted on a swinging arm for movement away from the fingers toward the other electrode.

* * * * *